United States Patent
Biwa et al.

(10) Patent No.: US 11,557,492 B2
(45) Date of Patent: Jan. 17, 2023

(54) SUBSTRATE PROCESSING APPARATUS AND CONTROL METHOD THEREOF

(71) Applicant: Tokyo Electron Limited, Tokyo (JP)

(72) Inventors: Satoshi Biwa, Kumamoto (JP); Satoshi Okamura, Kumamoto (JP); Gentaro Goshi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 226 days.

(21) Appl. No.: 16/890,041

(22) Filed: Jun. 2, 2020

(65) Prior Publication Data

US 2020/0388512 A1 Dec. 10, 2020

(30) Foreign Application Priority Data

Jun. 4, 2019 (JP) .............................. JP2019-104799

(51) Int. Cl.
*H01L 21/67* (2006.01)
*H01L 21/02* (2006.01)
*B08B 3/04* (2006.01)
*B08B 7/04* (2006.01)
*B08B 7/00* (2006.01)

(52) U.S. Cl.
CPC .......... *H01L 21/67034* (2013.01); *B08B 3/04* (2013.01); *B08B 7/0021* (2013.01); *B08B 7/04* (2013.01); *H01L 21/02101* (2013.01)

(58) Field of Classification Search
CPC ......... H01L 21/67034; H01L 21/02101; B08B 3/04; B08B 7/0021; B08B 7/04

USPC ....................................................... 134/104.2
See application file for complete search history.

(56) References Cited

U.S. PATENT DOCUMENTS

2015/0170938 A1* 6/2015 Seigeot ................ F04C 23/003
137/240
2018/0130675 A1* 5/2018 Goshi ...................... B01J 3/008

FOREIGN PATENT DOCUMENTS

JP 2013-012538 A 1/2013

* cited by examiner

*Primary Examiner* — Tinsae B Ayalew
(74) *Attorney, Agent, or Firm* — Venjuris, P.C.

(57) ABSTRACT

A substrate processing apparatus includes: a processing container including a processing space capable of accommodating a substrate in a state where a surface of the substrate is wet by a liquid; a processing fluid supply that supplies a processing fluid in a supercritical state to the processing space toward the liquid; a first exhaust line connected to a first exhaust source; a second exhaust line connected to a second exhaust source and connected to the first exhaust line between the first exhaust source and the processing space; and a controller controlling the second exhaust pressure. The processing fluid in the supercritical state contacts the liquid to dry the substrate, and the controller makes the second exhaust pressure to be higher than the first exhaust pressure during a period in which the processing fluid supply stops supplying the processing fluid to the processing space.

10 Claims, 14 Drawing Sheets

FIG. 8A
FIG. 8B
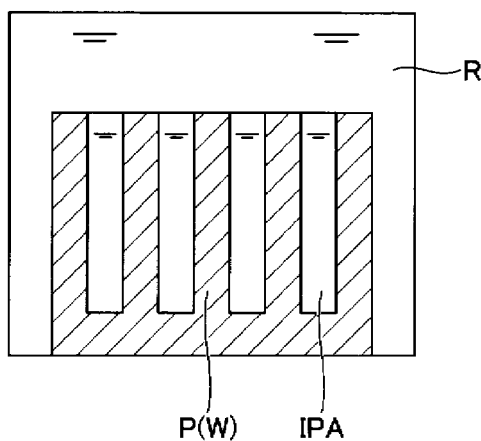
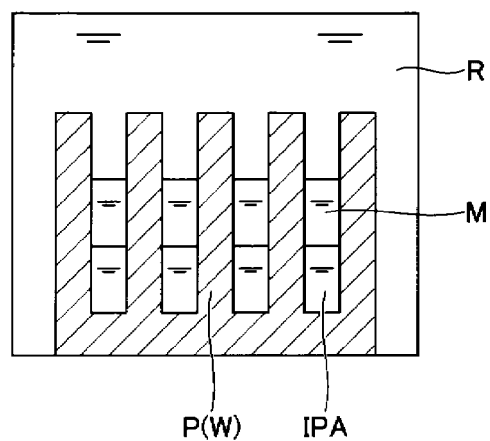
FIG. 8C
FIG. 8D
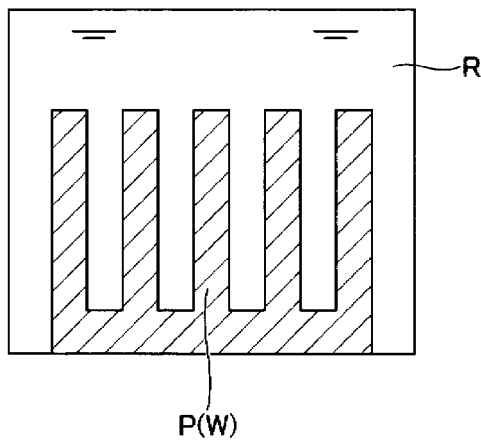
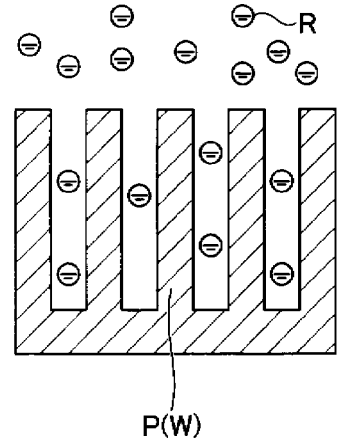

SUBSTRATE PROCESSING APPARATUS AND CONTROL METHOD THEREOF

CROSS-REFERENCE TO RELATED APPLICATION

This application is based on and claims priority from Japanese Patent Application No. 2019-104799 filed on Jun. 4, 2019 with the Japan Patent Office, the disclosure of which is incorporated herein in its entirety by reference.

TECHNICAL FIELD

The present disclosure relates to a substrate processing apparatus and a control method thereof.

BACKGROUND

In the manufacturing process of a semiconductor device in which a laminated structure of integrated circuits is formed on the surface of a semiconductor wafer, which is a substrate (hereinafter, referred to as a wafer), a liquid processing step of processing a surface of a wafer using a liquid is performed, for example, by removing minute dust and a native oxide film on the surface of the wafer with a cleaning liquid such as a chemical liquid. A method is known in which a processing fluid in a supercritical state is used when removing a liquid adhering to the surface of a wafer in a liquid processing step (see, e.g., Japanese Patent Laid-Open Publication No. 2013-012538).

SUMMARY

A substrate processing apparatus according to an aspect of the present disclosure includes: a processing container including a processing space capable of accommodating a substrate in a state where a surface of the substrate is wet by a liquid; a processing fluid supply configured to supply a processing fluid in a supercritical state to the processing space toward the liquid; a first exhaust line connected to a first exhaust source and configured to exhaust the processing space at a first exhaust pressure; a second exhaust line connected to a second exhaust source different from the first exhaust source and connected to the first exhaust line between the first exhaust source and the processing space to exhaust the processing space through the first exhaust line at a second exhaust pressure; and a controller configured to control the second exhaust pressure. The processing fluid in the supercritical state contacts the liquid to dry the substrate. The controller controls the second exhaust pressure to be higher than the first exhaust pressure during a period in which the processing fluid supply stops supplying the processing fluid to the processing space.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 8A to 8D are views illustrating a drying mechanism of IPA.

DETAILED DESCRIPTION

Figure 1:
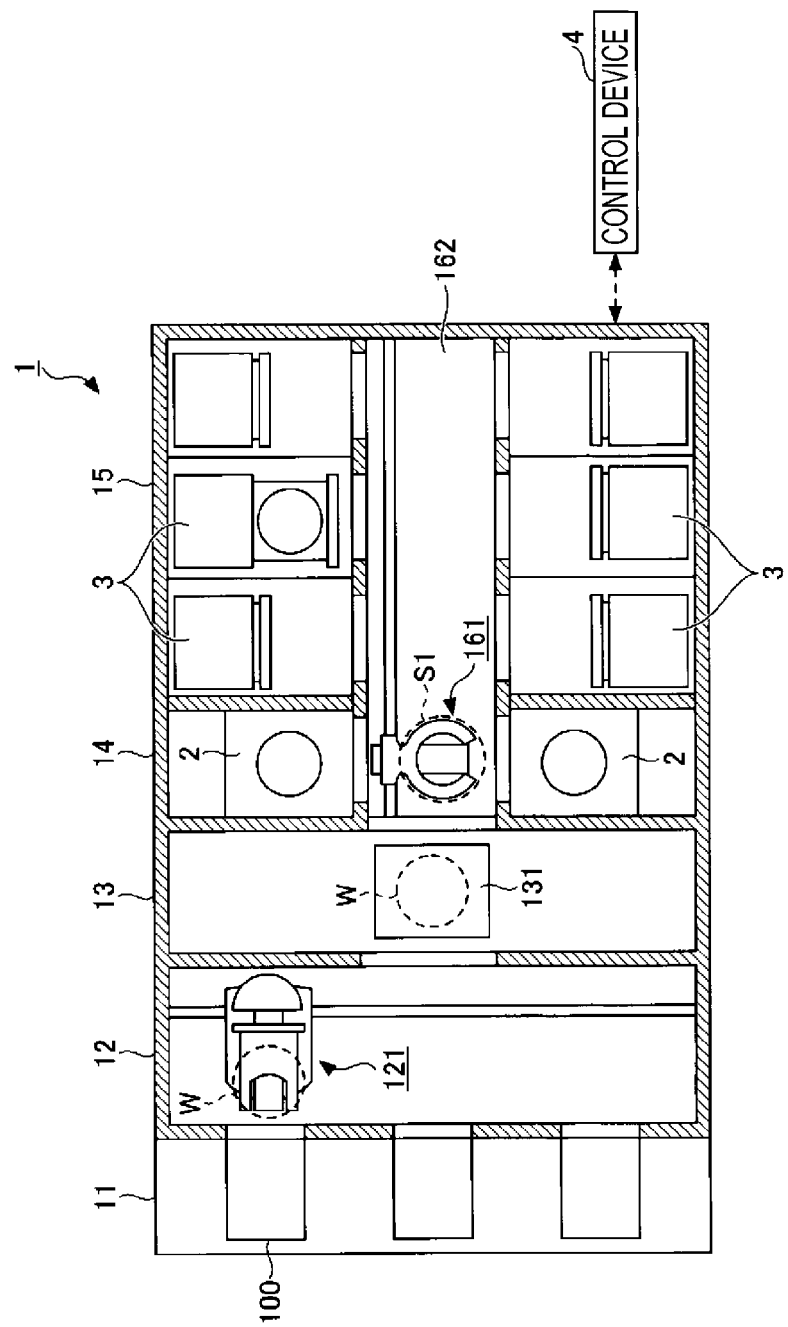
FIG. 1 is a cross-sectional plan view illustrating an example of the entire configuration of a cleaning processing system.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described. In the drawings, the same or corresponding components are denoted by the same or corresponding reference numerals, the descriptions of which will be omitted.

[Configuration of Cleaning Processing System]

FIG. 1 is a cross-sectional plan view illustrating an example of the entire configuration of a cleaning processing system 1.

The cleaning system 1 includes a plurality of cleaning apparatuses 2 that supplies a cleaning liquid to a wafer W to perform a cleaning process (two cleaning apparatuses 2 in the example illustrated in FIG. 1), and a plurality of supercritical processing apparatuses 3 that removes a liquid for preventing drying (isopropyl alcohol (IPA) in the present embodiment) which adheres to the wafer W after the cleaning process by bring the liquid into contact with a processing fluid in a supercritical state (carbon dioxide ($CO_2$) in the present embodiment) (six supercritical processing apparatuses 3 in the example illustrated in FIG. 1).

In the cleaning processing system 1, a carrier 100 is placed on a placing section 11, and the wafer W stored in the carrier 100 is transferred to a cleaning processing section 14 and a supercritical processing section 15 via a loading/ unloading section 12 and a delivery section 13. As for the carrier 100, for example, a front-opening unified pod (FOUP) is used. In the cleaning processing section 14 and the supercritical processing section 15, the wafer W is first loaded into a cleaning apparatus 2 provided in the cleaning processing section 14 and subjected to a cleaning process. Thereafter, the wafer W is loaded into the supercritical processing apparatus 3 provided in the supercritical processing section 15 and subjected to a drying process by which IPA is removed from the wafer W. In FIG. 1, reference numeral "121" denotes a first transfer mechanism that transfers the wafer W between the carrier 100 and the delivery section 13, and reference numeral "131" denotes a delivery shelf that plays a role as a buffer on which the wafer W transferred among the loading/unloading section 12, the cleaning processing section 14, and the supercritical processing section 15 is temporarily placed.

A wafer transfer path 162 is connected to an opening of the delivery section 13, and the cleaning processing section 14 and the supercritical processing section 15 are provided along the wafer transfer path 162. In the cleaning processing section 14, one cleaning apparatus 2 is disposed on each side of the wafer transport path 162 interposed therebetween, and thus, two cleaning apparatuses 2 are provided in total. Meanwhile, in the supercritical processing section 15, three supercritical processing apparatuses 3, each of which functions as a substrate processing apparatus that performs a drying process for removing IPA from the wafer W, are disposed on each side of the wafer transport path 162 interposed therebetween, and thus, six supercritical processing apparatuses 3 are provided in total. A second transfer mechanism 161 is provided in the wafer transfer path 162, and the second transfer mechanism 161 is provided to be movable in the wafer transfer path 162. The wafer W placed on the delivery shelf 131 is received by the second transfer mechanism 161, and the second transfer mechanism 161 loads the wafer W into the cleaning apparatus 2 and the supercritical processing apparatus 3. Further, the number and arrangement of the cleaning apparatus 2 and the supercritical processing apparatus 3 are not particularly limited, and appropriate numbers of the cleaning apparatuses 2 and the supercritical processing apparatuses 3 are disposed in an appropriate manner depending on the number of wafers W processed per unit time and the processing time of each cleaning apparatus 2 and each supercritical processing apparatus 3.

The cleaning apparatus 2 is configured as a single-wafer apparatus that cleans wafers W one by one, for example, by spin cleaning. In this case, the cleaning process of the wafer W may be performed by supplying a chemical liquid for cleaning or a rinse liquid for washing the chemical liquid to a surface of the wafer W to be treated at an appropriate timing, while holding horizontally and rotating the wafer W around the vertical axis. The chemical liquid and the rinse liquid used in the cleaning apparatus 2 are not particularly limited. For example, an SC1 solution (i.e., a mixture of ammonia and hydrogen peroxide), which is an alkaline chemical liquid, may be supplied to the wafer W to remove particles and organic contaminants from the wafer W. Thereafter, deionized water (DIW), which is a rinse liquid, is supplied to the wafer W to wash away the SC1 solution from the wafer W. In addition, a diluted hydrofluoric acid (DHF) aqueous solution, which is an acidic chemical liquid, may be supplied to the wafer W to remove a native oxide film, and then the DIW may be supplied to the wafer W to wash away the diluted hydrofluoric acid aqueous solution from the wafer W.

Then, after finishing the cleaning process with the chemical liquid, the cleaning apparatus 2 stops rotating the wafer W, supplies IPA serving as a liquid for preventing drying to the wafer W, and replaces the DIW remaining on the processing surface of the wafer W with the IPA. At this time, a sufficient amount of IPA is supplied to the wafers W, so that the surface of the wafer W on which a semiconductor pattern is formed is in a state where IPA is filled thereon, and a liquid film of the IPA is formed on the surface of the wafer W. The wafer W is unloaded from the cleaning apparatus 2 by the second transfer mechanism 161 while the IPA is filled.

The IPA applied to the surface of the wafer W in this manner serves to suppress the wafers W from drying. In particular, in order to suppress a so-called pattern collapse from occurring in the wafer W due to the evaporation of the IPA while the wafer W is transferred from the cleaning apparatus 2 to the supercritical processing apparatus 3, the cleaning apparatus 2 applies a sufficient amount of IPA to the wafer W so that an IPA film having a relatively large thickness is formed on the surface of the wafer W.

The wafer W unloaded from the cleaning apparatus 2 is loaded into the processing container of the supercritical processing apparatus 3 by the second transfer mechanism 161 in a state where the IPA is filled, and a drying process of the IPA is performed in the supercritical processing apparatus 3.

[Supercritical Processing Apparatus]

Next, descriptions will be made on the details of the drying process using the supercritical fluid performed in the supercritical processing apparatus (substrate processing apparatus) 3. First, descriptions will be made on a configuration example of a processing container in which the wafer W is loaded in the supercritical processing apparatus 3.

Figure 2:
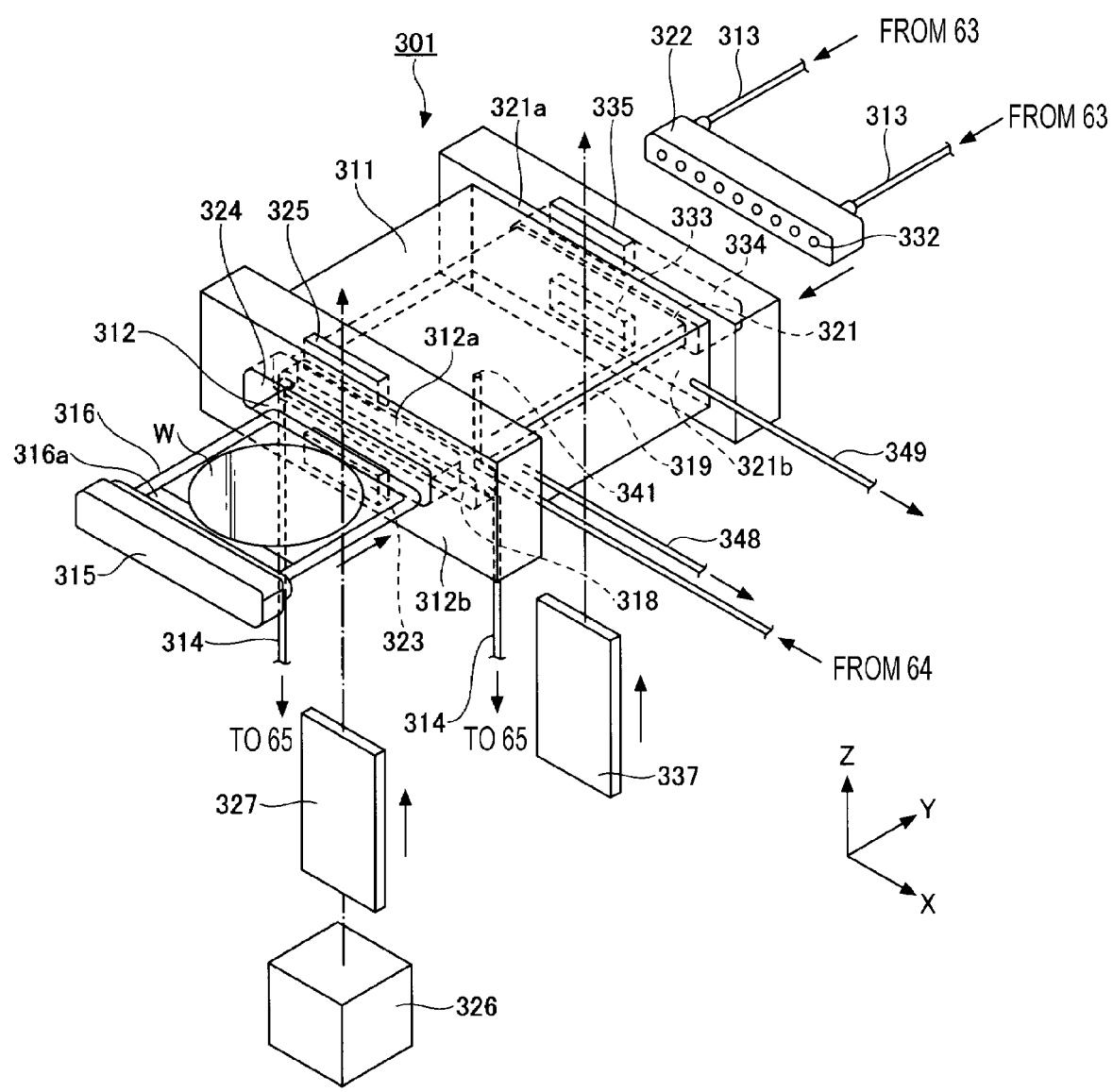
FIG. 2 is an external perspective view illustrating an example of a processing container of a supercritical processing apparatus.
Figure 3:
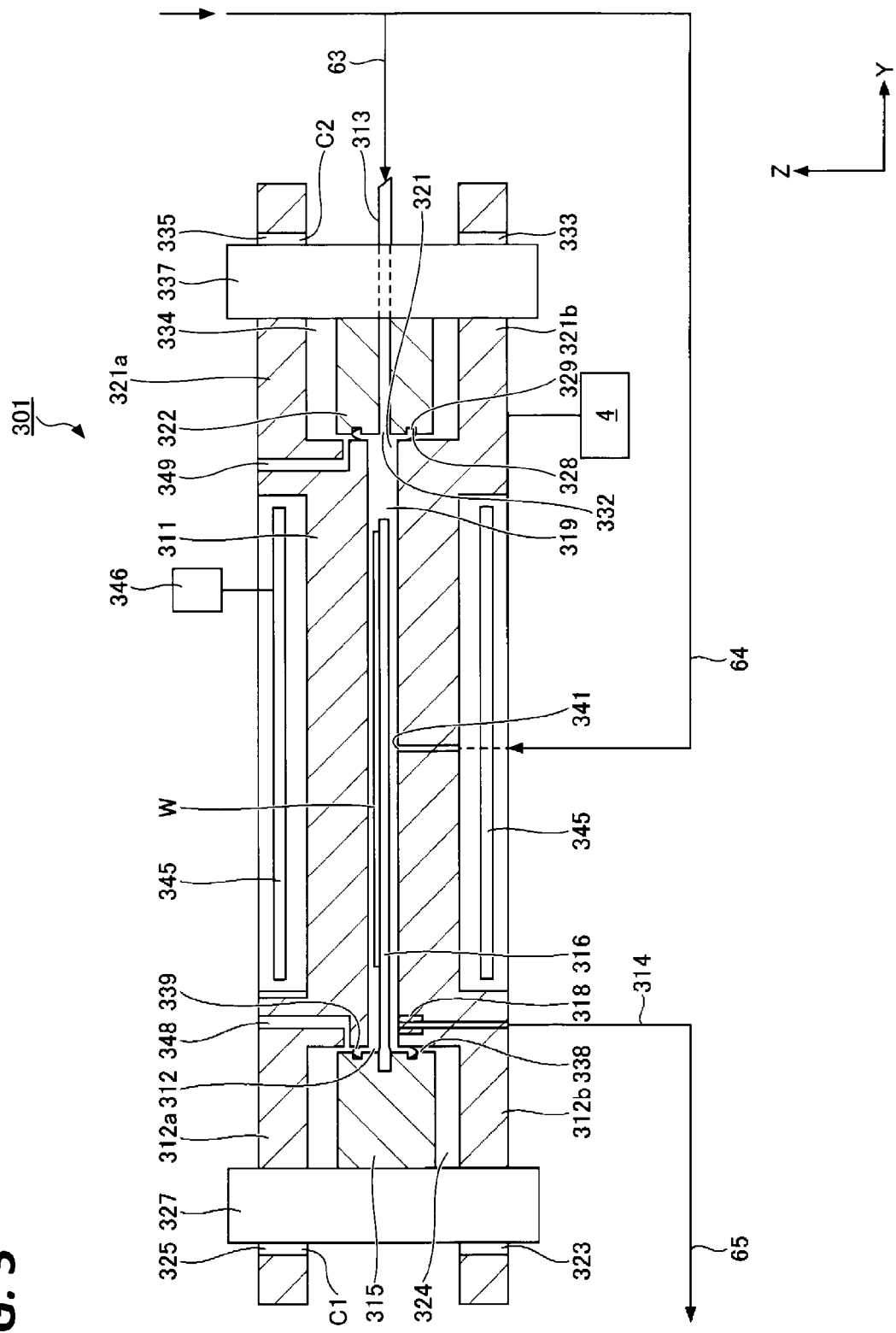
FIG. 3 is a cross-sectional view illustrating an example of the processing container.

FIG. 2 is an external perspective view illustrating an example of the processing container 301 of the supercritical processing apparatus 3, and FIG. 3 is a cross-sectional view illustrating an example of the processing container 301.

The processing container 301 accommodates the wafer W and performs a processing on the wafer W using a high-pressure processing fluid such as a supercritical fluid. The processing container 301 includes a housing-shaped container body 311 that that accommodates the wafer W, a transfer port 312 that loads and unloads the wafer W into/from the container body 311, a holding plate that laterally holds the wafer W to be processed, and a first lid member 315 that supports the holding plate 316 and seals the transfer port 312 when the wafer W is loaded into the container body 311. Further, a maintenance opening 321 is provided at a position different from the transfer port 312 in the container body 311. The maintenance opening 321 is closed by a second lid member 322 except during maintenance.

The container body 311 accommodates the wafer W and performs a processing on the wafer W using a processing fluid. The container body 311 is a container in which a processing space which is capable of accommodating the wafer W each having, for example, a diameter of 300 mm is formed. The above-described transfer port 312 and maintenance opening 321 (e.g., an opening having the same size and shape as the transfer port 312) are formed at both ends of the processing space 319, and both communicate with the processing space 319.

Further, a discharge port 314 is provided on the wall portion of the container body 311 on the side of the transfer port 312. The discharge port 314 is connected to a discharge side supply line 65 (see, e.g., FIG. 6) provided on the downstream side of the processing container 301 for circulating the processing fluid. In addition, FIG. 2 illustrates two discharge ports 314, but the number of the discharge ports 314 is not particularly limited.

Fitting holes 325 and 323 for fitting a first lock plate 327 (to be described later) are formed in a first upper block 312a and a first lower block 312b, which are located above and below the transfer port 312, respectively. The fitting holes 325 and 323 penetrate the first upper block 312a and the first lower block 312b in the vertical direction (the direction perpendicular to the surface of the wafer W).

The holding plate 316 is a thin plate-shaped member that may be horizontally disposed in the processing space 319 of the container body 311 while holding the wafer W, and is connected to the first lid member 315. Further, a discharge port 316a is provided on the first lid member 315 side of the holding plate 316.

A first lid member accommodating space 324 is formed in a region on the front side (negative side of the Y direction) of the container body 311. The first lid member 315 is accommodated in the first lid member accommodating space 324 when the holding plate 316 is loaded into the processing container 301 and the wafer W is subjected to the supercritical processing. In this case, the first lid member 315 closes the processing space 319 by closing the transfer port 312.

The first lock plate 327 is provided on the front side of the processing container 301. The first lock plate 327 serves as a restricting member that restricts the movement of the first lid member 315 due to the pressure inside the container body 311 when the holding plate 316 is moved to the processing position. The first lock plate 327 is fitted into the fitting hole 323 of the first lower block 312b and the fitting hole 325 of the first upper block 312a. At this time, since the first lock plate 327 serves as a bar, the movement of the first lid member 315 and the holding plate 316 in the front-rear direction (Y direction in FIGS. 2 and 3) is restricted. Then, the first lock plate 327 moves in the vertical direction by an elevating mechanism 326 between a lock position which is fitted into the fitting holes 323 and 325 and presses the first lid member 315, and an open position which retracts downward from the lock position to open the first lid member 315. In this example, the first lock plate 327, the fitting holes 323 and 325, and the elevating mechanism 326 constitute a restricting mechanism that restricts the movement of the first lid member 315 due to the pressure in the container body 311. Further, since the fitting holes 323 and 325 are respectively provided with margins for inserting and removing the first lock plate 327, a slight gap C1 (see, e.g., FIG. 3) is formed between the fitting holes 323 and 325 and the first lock plate 327 in the lock position. For convenience of illustration, the gap C1 is exaggerated in FIG. 3.

The maintenance opening 321 is provided on the wall surface of the container body 311 and at a position facing the transfer port 312. Since the maintenance opening 321 and the transfer port 312 face each other in this manner, when the container body 311 is sealed by the first lid member 315 and the second lid member 322, the pressure in the processing space 319 is substantially evenly applied to the inner surface of the container body 311. Therefore, it is possible to suppress stress from being concentrated on a specific portion of the container body 311. However, the maintenance opening 321 may be provided at positions other than the position facing the transfer port 312, for example, a wall surface lateral to the traveling direction of the wafer W (Y direction).

A second upper block 321a and a second lower block 321b are located above and below the maintenance opening 321, respectively. Fitting holes 335 and 333 for fitting the second lock plate 337 are formed in the second upper block 321a and the second lower block 321b, respectively. The fitting holes 335 and 333 penetrate the second upper block 321a and the second lower block 321b, respectively, in the vertical direction (the direction perpendicular to the surface of the wafer W, i.e., the Z direction).

A second lid member accommodating space 334 is formed in a region on the inner side of the container body 311 (the positive side of the Y direction). The second lid member 322 is accommodated in the second lid member accommodating space 334 except at the time of maintenance, and closes the maintenance opening 321. Further, the second lid member 322 is provided with a supply port 313. The supply port 313 is provided on the upstream side of the processing container 301 and is connected to a first supply line 63 (see, e.g., FIG. 6) for circulating the processing fluid. In addition, FIG. 2 illustrates two supply ports 313, but the number of the supply ports 313 is not particularly limited.

The second lock plate 337 serves as a restricting member that restricts the movement of the second lid member 322 due to the pressure inside the container body 311. The second lock plate 337 is fitted into the fitting holes 333 and 335 around the maintenance opening 321. At this time, since the second lock plate 337 serves as a bar, the movement of the second lid member 322 in the front-rear direction (Y direction) is restricted. Then, the second lock plate 337 is configured to move in the vertical direction between a lock position which is fitted into the fitting holes 333 and 335 and presses the second lid member 322, and an open position which retracts downward from the lock position to open the second lid member 322. In the present embodiment, the second lock plate 337 is configured to be manually moved but may be automatically moved by providing an elevating mechanism that is substantially the same as the elevating mechanism 326. Further, since the fitting holes 333 and 335 are provided with margins for inserting and removing the second lock plate 337, a slight gap C2 (see, e.g., FIG. 3) is formed between the fitting holes 333 and 335 and the second lock plate 337 in the lock position. For convenience of illustration, the gap C2 is exaggerated in FIG. 3.

In the present embodiment, the second lid member 322 is connected to the first supply line 63, and the second lid member 322 is provided with many openings 332. The second lid member 322 serves as a fluid supply header that supplies the processing fluid from the first supply line 63 to the inside of the container body 311. Accordingly, when the second lid member 322 is removed during maintenance, maintenance work such as cleaning of the opening 332 may be easily performed. Further, a fluid discharge header 318 that communicates with the discharge port 314 is provided on the wall portion of the container body 311 on the side of the transfer port 312. The fluid discharge header 318 is also provided with many openings.

The second lid member 322 and the fluid discharge header 318 are installed to face each other. The second lid member 322 that functions as a fluid supply supplies the processing fluid into the container body 311 in a substantially horizontal direction. The horizontal direction referred to herein is a direction perpendicular to the vertical direction in which gravity acts and is generally parallel to a direction in which the flat surface of the wafer W held by the holding plate 316 extends. The fluid discharge header 318, which functions as a fluid discharge that discharges the fluid in the container body 311, guides and discharges the fluid in the container body 311 to the outside of the container body 311 through the discharge port 316a provided in the holding plate 316. The fluid discharged 311 to the outside of the container body 311 through the fluid discharge header 318 includes the IPA dissolved in the processing fluid from the surface of the wafer W in addition to the processing fluid supplied into the processing container 311 through the second lid member 322. As described above, by supplying the processing fluid into the container body 311 from the opening 332 of the second lid member 322 and discharging the fluid from the container body 311 through the opening of the fluid discharge header 318, a laminar flow of the processing fluid that flows substantially parallel to the surface of the wafer W is formed in the container body 311.

Further, vacuum suction pipes 348 and 349 are connected to the side surfaces of the container body 311 on the side of the transfer port 312 and on the side of the maintenance opening 321, respectively. The vacuum suction pipes 348 and 349 communicate with the surfaces of the container body 311 on the side of the first lid member accommodating space 324 and on the side of the second lid member accommodating space 334, respectively. The vacuum suction pipes 348 and 349 play a role of attracting the first lid member 315 and the second lid member 322, respectively, to the container body 311 side by a vacuum suction force.

A bottom side fluid supply 341 configured to supply the processing fluid to the inside of the processing container 311 is provided at the bottom of the container body 311. The bottom side fluid supply 341 is connected to the second supply line 64 (see, e.g., FIG. 6) that supplies a high-pressure fluid into the container body 311. The bottom side fluid supply 341 supplies the processing fluid into the container body 311 from substantially below to above. The processing fluid supplied from the bottom side fluid supply 341 wraps around from the back surface of the wafer W to the front surface of the wafer W through the discharge port 316a provided in the holding plate 316, and together with the processing fluid from the second lid member 322, is discharged from the fluid discharge header 318 through the discharge port 316a provided in the holding plate 316. The position of the bottom side fluid supply 341 is preferably, for example, below the wafer W introduced into the container body 311, and more preferably, below the center of the wafer W. As a result, the processing fluid from the bottom side fluid supply 341 may be caused to uniformly wrap around the surface of the wafer W.

As illustrated in FIG. 3, heaters 345 including resistance heating elements such as tape heaters are provided on both upper and lower surfaces of the container body 311. Each of the heaters 345 is connected to a power supply 346, and may increase or decrease the output of the power supply 346 to maintain the temperature of the container body 311 and the processing space 319 within the range of, for example, 100° C. to 300° C.

[Configuration Around Maintenance Opening]

Figure 4:
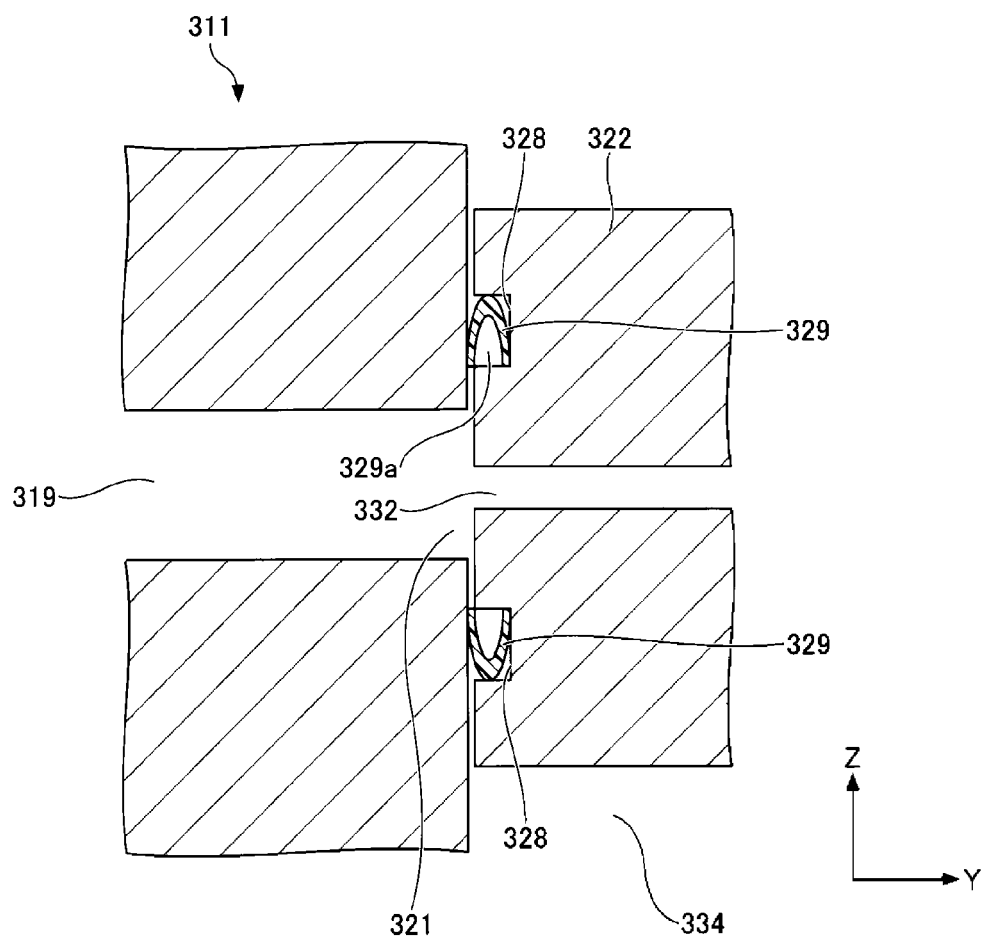
FIG. 4 is a cross-sectional view (1) illustrating a periphery of a maintenance opening of the processing container.
Figure 5:
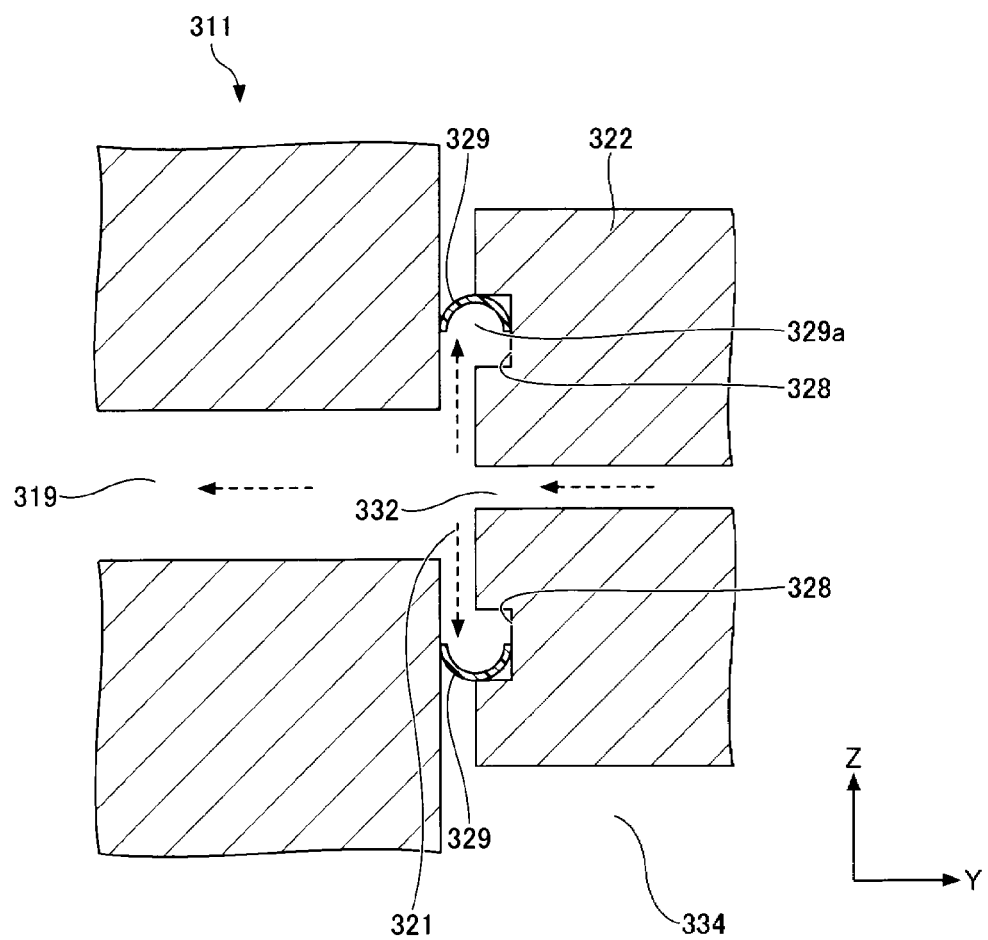
FIG. 5 is a cross-sectional view (2) illustrating a periphery of a maintenance opening of the processing container.

Next, the configuration around the maintenance opening 321 will be further described with reference to FIGS. 4 and 5. FIGS. 4 and 5 are cross-sectional views illustrating the periphery of the maintenance opening 321.

As illustrated in FIGS. 4 and 5, a recess 328 is formed on the side wall of the second lid member 322 on the processing space 319 side to surround a position corresponding to the peripheral edge of the maintenance opening 321. By fitting a seal member 329 into the recess 328, the seal member 329 is disposed on the side wall surface on the second lid member 322 side that abuts the side wall surface around the maintenance opening 321.

The seal member 329 is formed in an annular shape to surround the maintenance opening 321. The cross-sectional shape of the seal member 329 is U-shaped. In the seal member 329 illustrated in FIGS. 4 and 5, a U-shaped notch 329a is formed along the inner peripheral surface of the annular seal member 329. In other words, the seal member 329 is formed with an internal space (notch 329a) surrounded by a U shape.

By closing the periphery of the maintenance opening 321 using the second lid member 322 provided with the seal member 329, the seal member 329 is disposed between the facing surface of the second lid member 322 and the container body 311 to close the gap between the second lid member 322 and the processing space 319. Since the gap is formed around the maintenance opening 321 in the container body 311, the notch 329a formed along the inner peripheral surface of the seal member 329 is in a state of communicating with the processing space 319.

The seal member 329 whose notch 329a communicates with the processing space 319 is exposed to the atmosphere of the processing fluid, but the processing fluid may elute components such as resin and rubber, and impurities contained therein. Therefore, in the seal member 329, at least the inside of the notch 329a opened toward the processing space 319 is made of a resin having corrosion resistance against the liquid IPA and the processing fluid. Examples of such a resin include polyimide, polyethylene, polypropylene, paraxylene, and polyetheretherketone (PEEK). It is preferable to use a non-fluorine-based resin that has a small effect on the semiconductor device even when a slight amount of the components is eluted into the processing fluid.

Here, descriptions will be made on an operation of the processing container 301 including the seal member 329 when processing the wafer W using the high-pressure processing fluid in the processing container 301.

First, when the high-pressure processing fluid is not supplied to the processing space 319 and the pressure in the container body 311 is not increased, the second lid member 322 is attracted to the container body 311 side by the suction force from the vacuum suction pipe 349 (see, e.g., FIGS. 2 and 3). At this time, as illustrated in FIG. 4, the side wall surfaces of the second lid member 322 and the container body 311 directly face each other and crush the seal member 329 to hermetically close the periphery of the maintenance opening 321. The seal member 329 crushed by the second lid member 322 and the container body 311 deforms in a direction in which the notch 329a becomes narrower. When the notch 329a is not completely closed, at this time, the atmosphere in the processing space 319 flows into the notch 329a through the gap between the second lid member 322 and the container body 311.

In the meantime, when a high-pressure processing fluid is supplied from the opening 332 into the processing space 319, the second lid member 322 moves in a direction away from the maintenance opening 321. That is, the second lid member 322 moves by the gap C2 (see, e.g., FIG. 3) between the fitting holes 335 and 333 around the maintenance opening 321 and the second lock plate 337 due to the pressure received from the processing fluid. When the gap between the second lid member 322 and the container body 311 becomes wider due to the movement of the second lid member 322, the notch 329a widens due to the restoring force of the elastic seal member 329, and as illustrated in FIG. 5, the atmosphere (processing fluid) of the processing space 319 further enters the notch 329a (internal space).

When the processing fluid enters the notch 329a, the seal member 329 is enlarged from the inside of the notch 329a, and a force presses the outer peripheral surface of the seal member 329 (the surface opposite to the notch 329a) toward the surface of the second lid member 322 on the recess 328 side and the side wall surface of the container body 311. As a result, the outer peripheral surface of the seal member 329 comes into close contact with the second lid member 322 and the container body 311 and hermetically closes the gap between the second lid member 322 and the container body 311. This type of the seal member 329 has elasticity capable of being deformed by a force received from the processing fluid, and may maintain a state where the gap is hermetically closed against a pressure difference between the processing space 319 and the outside (e.g., about 16 to 20 MPa).

Further, in the present embodiment, the transfer port 312 of the container body 311 is also sealed by the first lid member 315, similarly to the transfer port 312.

That is, as illustrated in FIG. 3, a recess 338 is formed on the side wall of the first lid member 315 on the processing space 319 side to surround a position corresponding to the peripheral edge of the transfer port 312. By fitting a seal member 339 into the recess 338, the seal member 339 is disposed on the side wall surface on the first lid member 315 side that abuts the side wall surface around the transfer port 312.

The seal member 339 is formed in an annular shape to surround the transfer port 312. The cross-sectional shape of the seal member 339 is U-shaped. By closing the transfer port 312 using the first lid member 315 provided with the seal member 339, the seal member 339 is disposed between the facing surface of the first lid member 315 and the container body 311 to close the gap between the first lid member 315 and the transfer port 312. In addition, the configuration for closing the transfer port 312 using the first lid member 315 and the seal member 339 is substantially the same as the configuration for closing the maintenance opening 321 described above.

[Configuration of Entire System of Supercritical Processing Apparatus]

Figure 6:
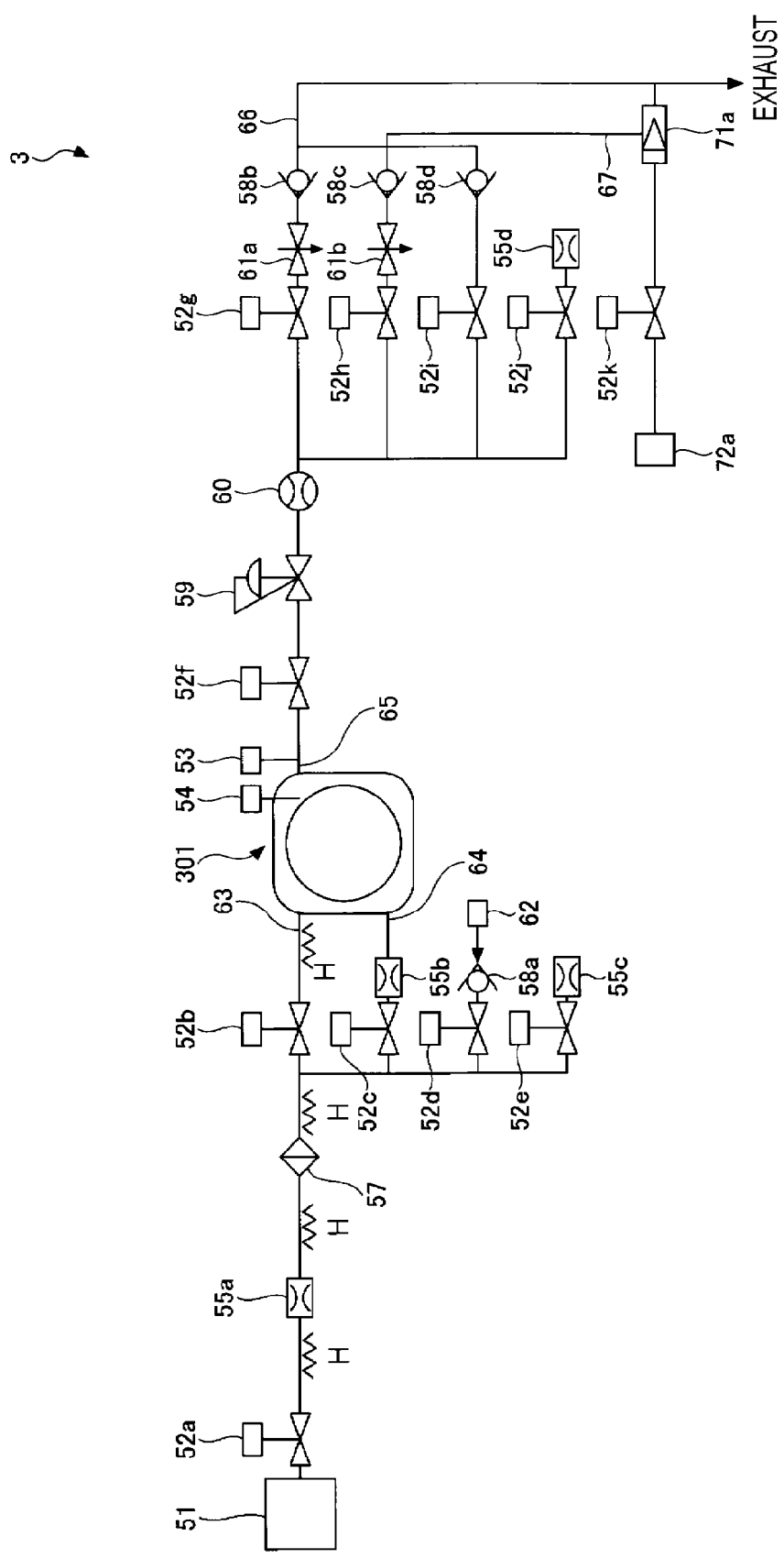
FIG. 6 is a view illustrating a configuration example of the entire system of the supercritical processing apparatus according to the first embodiment.

FIG. 6 is a view illustrating a configuration example of the entire system of the supercritical processing apparatus 3 according to the first embodiment.

A fluid supply tank 51 is provided on the upstream side of the processing container 301, and the processing fluid is supplied from the fluid supply tank 51 to a supply line for circulating the processing fluid in the supercritical processing apparatus 3. A circulation on/off valve 52a, an orifice 55a, a filter 57, and a circulation on/off valve 52b are sequentially provided between the fluid supply tank 51 and the processing container 301 from the upstream side to the downstream side. In addition, the phrases "upstream side" and "downstream side" used herein refer to the flow direction of the processing fluid in the supply line.

The circulation on/off valve 52a adjusts the on/off of supply of the processing fluid from the fluid supply tank 51, and causes the processing fluid to flow to the supply line on the downstream side in the open state and the processing fluid not to flow to the supply line on the downstream side in the closed state. When the circulation on/off valve 52a is in the open state, a high-pressure processing fluid of, for example, about 16 to 20 MPa (megapascal) is supplied from the fluid supply tank 51 to the supply line via the circulation on/off valve 52a. The orifice 55a plays a role of adjusting the pressure of the processing fluid supplied from the fluid supply tank 51, and the processing fluid whose pressure is adjusted to, for example, about 16 MPa may be circulated in the supply line on the downstream side of the orifice 55a. The filter 57 removes foreign matters contained in the processing fluid sent from the orifice 55a and causes a clean processing fluid to flow to the downstream side.

The circulation on/off valve 52b adjusts the on/off of supply of the processing fluid to the processing container 301. The first supply line 63 extending from the circulation on/off valve 52b to the processing container 301 is connected to the supply port 313 described above with reference to FIGS. 2 and 3, and the processing fluid from the circulation on/off valve 52b is supplied into the container body 311 of the processing container 301 via the supply port 313 and the second lid member 322 illustrated in FIGS. 2 and 3.

Further, a supply line branches off between the filter 57 and the circulation on/off valve 52b in the supercritical processing apparatus 3 illustrated in FIG. 6. That is, from the supply line between the filter 57 and the circulation on/off valve 52b, a supply line (second supply line 64) connected to the processing container 301 via a circulation on/off valve 52c and an orifice 55b, a supply line connected to a purge device 62 via a circulation on/off valve 52d and a check valve 58a, and a supply line connected to the outside via a circulation on/off valve 52e and an orifice 55c branch off and extend.

The second supply line 64 connected to the processing container 301 via the circulation on/off valve 52c and the orifice 55b is connected to the bottom side fluid supply 341 described above with reference to FIGS. 2 and 3, and the processing fluid from the circulation on/off valve 52c is supplied into the container body 311 of the processing container 301 via the bottom side fluid supply 341 illustrated in FIGS. 2 and 3. The second supply line 64 may be used as an auxiliary flow path to supply the processing fluid to the processing container 301. For example, when a relatively large amount of processing fluid is supplied to the processing container 301 such as, for example, at the beginning of supplying the processing fluid to the processing container 301, the circulation on/off valve 52c is adjusted to the open state, and the processing fluid whose pressure is adjusted by the orifice 55b may be supplied to the processing container 301.

The supply line connected to the purge device 62 via the circulation on/off valve 52d and the check valve 58a is a flow path through which an inert gas such as nitrogen is supplied to the processing container 301, and is utilized while the supply of the processing fluid from the fluid supply tank 51 to the processing container 301 is stopped. For example, when the processing container 301 is filled with an inert gas and kept in a clean state, the circulation on/off valve 52d and the circulation on/off valve 52b are adjusted to the open state, and the inert gas sent from the purge device 62 to the supply line is supplied to the processing container 301 via the check valve 58a, the circulation on/off valve 52d, and the circulation on/off valve 52b.

The supply line connected to the outside via the circulation on/off valve 52e and the orifice 55c is a flow path through which the processing fluid is discharged from the supply line. For example, when the processing fluid remaining in the supply line between the circulation on/off valve 52a and the circulation on/off valve 52b is discharged to the outside when the power of the supercritical processing apparatus 3 is turned off, the circulation on/off valve 52e is adjusted to the open state, and the supply line between the circulation on/off valve 52a and the circulation on/off valve 52b is caused to communicate with the outside.

A circulation on/off valve 52f, an exhaust control valve 59, a concentration measuring sensor 60, and a circulation on/off valve 52g are sequentially provided downstream of the processing container 301 from the upstream side to the downstream side.

The circulation on/off valve 52*f* adjusts the on/off of discharge of the processing fluid to the processing container 301. When the processing fluid is discharged from the processing container 301, the circulation on/off valve 52*f* is adjusted to the open state, and when the processing fluid is not discharged from the processing container 301, the circulation on/off valve 52*f* is adjusted to the closed state. Further, the supply line (discharge side supply line 65) extending between the processing container 301 and the circulation on/off valve 52*f* is connected to the discharge port 314 illustrated in FIGS. 2 and 3. The fluid in the container body 311 of the processing container 301 is sent toward the circulation on/off valve 52*f* via the fluid discharge header 318 and the discharge port 314 illustrated in FIGS. 2 and 3. The circulation on/off valve 52*f* is an example of a first opening/closing valve.

The exhaust control valve 59 adjusts the discharge amount of the fluid from the processing container 301 and may be configured by, for example, a back pressure valve. The opening degree of the exhaust control valve 59 is adaptively adjusted under the control of the controller 4 according to the desired discharge amount of the fluid from the processing container 301. In the present embodiment, for example, a process of discharging the fluid from the processing container 301 is performed until the pressure of the fluid in the processing container 301 reaches a predetermined pressure. Therefore, when the pressure of the fluid in the processing container 301 reaches the predetermined pressure, the exhaust control valve 59 may stop the discharge of the fluid from the processing container 301 by adjusting the opening degree in order to shift from the open state to the closed state. The exhaust control valve 59 is an example of a back pressure valve.

The concentration measuring sensor 60 is a sensor that measures the IPA concentration contained in the fluid sent from the exhaust control valve 59.

The circulation on/off valve 52*g* is a valve that adjusts the on/off of discharging the fluid from the processing container 301 to the outside. When the fluid is discharged to the outside, the circulation on/off valve 52*g* is adjusted to the open state, and when the fluid is not discharged, the circulation on/off valve 52*g* is adjusted to the closed state. Further, an exhaust control needle valve 61*a* and a check valve 58*b* are provided on the downstream side of the circulation on/off valve 52*g*. The exhaust control needle valve 61*a* is a valve that adjusts the discharge amount of the fluid sent via the circulation on/off valve 52*g* to the outside, and the opening degree of the exhaust control needle valve 61*a* is adjusted according to the desired discharge amount of the fluid. The check valve 58*b* is a valve that prevents reverse flow of the discharged fluid, and plays a role of reliably discharging the fluid to the outside.

In addition, a supply line branches off between the concentration measuring sensor 60 and the circulation on/off valve 52*b* in the supercritical processing apparatus 3 illustrated in FIG. 6. That is, from the supply line between the concentration measuring sensor 60 and the circulation on/off valve 52*g*, a supply line connected to the outside via a circulation on/off valve 52*h*, a supply line connected to the outside via a circulation on/off valve 52*i*, and a supply line connected to the outside via a circulation on/off valve 52*j* branch off and extend.

The circulation on/off valve 52*h* and the circulation on/off valve 52*i* adjust on/off of discharge of the fluid to the outside, similarly to the circulation on/off valve 52*g*. An exhaust control needle valve 61*b* and a check valve 58*c* are provided on the downstream side of the circulation on/off valve 52*h* to adjust the discharge amount of the fluid and prevent the reverse flow of the fluid. A check valve 58*d* is provided on the downstream side of the circulation on/off valve 52*i* to prevent the reverse flow of the fluid. The circulation on/off valve 52*j* is also a valve that adjusts the on/off of discharge of the fluid to the outside, and an orifice 55*d* is provided on the downstream side of the circulation on/off valve 52*j* so that the fluid may be discharged from the circulation on/off valve 52*j* to the outside via the orifice 55*d*. However, in the example illustrated in FIG. 6, the destination of the fluid sent to the outside via the circulation on/off valve 52*g*, the circulation on/off valve 52*h*, and the circulation on/off valve 52*i* is different from the destination of the fluid sent to the outside via the circulation on/off valve 52*j*. Therefore, it is possible to discharge the fluid to the atmosphere via the circulation on/off valve 52*j* while sending the fluid to a recovery device (not illustrated) via, for example, the circulation on/off valve 52*g*, the circulation on/off valve 52*h*, and the circulation on/off valve 52*i*.

The supply lines on the downstream sides of the circulation on/off valve 52*g*, the circulation on/off valve 52*h*, and the circulation on/off valve 52*i* branch off into two exhaust lines, that is, a first exhaust line 66 and a second exhaust line 67. The first exhaust line 66 is connected to an exhaust line of a factory. A first exhaust source is provided in an exhaust line of a factory. The second exhaust line 67 is connected to the exhaust line of a factory via an ejector 71*a*. The ejector 71*a* receives the flow of a fluid such as air from a fluid supply source 72*a*, decompresses the inside of the second exhaust line 67, and forcibly exhausts the second exhaust line 67. A circulation on/off valve 52*k* is provided between the ejector 71*a* and the fluid supply source 72*a*. The circulation on/off valve 52*k* is a valve that adjusts the on/off of supply of the fluid from the fluid supply source 72*a* to the ejector 71*a*. When the circulation on/off valve 52*k* is in the closed state, since the fluid does not flow through the ejector 71*a*, the forced exhaust of the second exhaust line 67 by the ejector 71*a* is not performed. When the circulation on/off valve 52*k* is in the open state, the fluid flows through the ejector 71*a*, and the forced exhaust of the second exhaust line 67 by the ejector 71*a* is performed. Therefore, when the circulation on/off valve 52*k* is adjusted to the open state while the discharge side supply line 65 between the second exhaust line 67 and the processing container 301 is opened, the inside of the discharge side supply line 65 is forcibly exhausted. A first exhaust source is provided in an exhaust line of a factory. The ejector 71*a* is included in the second exhaust source. The circulation on/off valve 52*k* is an example of a second opening/closing valve. The exhaust pressure by the ejector 71*a* when operating is stronger than the exhaust pressure by the exhaust line of a factory. The exhaust pressure by the exhaust line of a factory is an example of the first exhaust pressure, and the exhaust pressure by the ejector 71*a* is an example of the second exhaust pressure. The second exhaust source may include a vacuum pump instead of the ejector 71*a*.

When the fluid is discharged from the processing container 301, at least one of the circulation on/off valve 52*g*, the circulation on/off valve 52*h*, the circulation on/off valve 52*i*, and the circulation on/off valve 52*j* is adjusted to the open state. In particular, when the power of the supercritical processing apparatus 3 is turned off, the circulation on/off valve 52*j* may be adjusted to the open state so that the fluid remaining in the supply line between the concentration measuring sensor 60 and the circulation on/off valve 52*g* is discharged to the outside.

A pressure sensor that detects the pressure of the fluid, and a temperature sensor that detects the temperature of the fluid are provided on the supply line described above. In the example illustrated in FIG. 6, a pressure sensor 53 is provided between the processing container 301 and the circulation on/off valve 52f, and a temperature sensor 54 is provided to detect the temperature of the fluid in the container body 311 inside the processing container 301. The pressure sensor and the temperature sensor may be provided at various points in the supply line as required.

Further, in the supercritical processing apparatus 3, a heater H is provided at an arbitrary position where the processing fluid flows. FIG. 6 illustrates the heater H provided in a supply line on the upstream side of the processing container 301 (i.e., between the circulation on/off valve 52a and the orifice 55a, between the orifice 55a and the filter 57, between the filter 57 and the circulation on/off valve 52b, and between the circulation on/off valve 52b and the processing container 301). However, the heater H may be provided at other positions including the processing container 301 and the supply line on the downstream side of the processing container 301. Therefore, the heater H may be provided in all the flow paths until the processing fluid supplied from the fluid supply tank 51 is discharged to the outside. Further, in particular, from the viewpoint of adjusting the temperature of the processing fluid supplied to the processing container 301, it is preferable that the heater H is provided at a position where the temperature of the processing fluid flowing on the upstream side of the processing container 301 may be adjusted.

Figure 7:
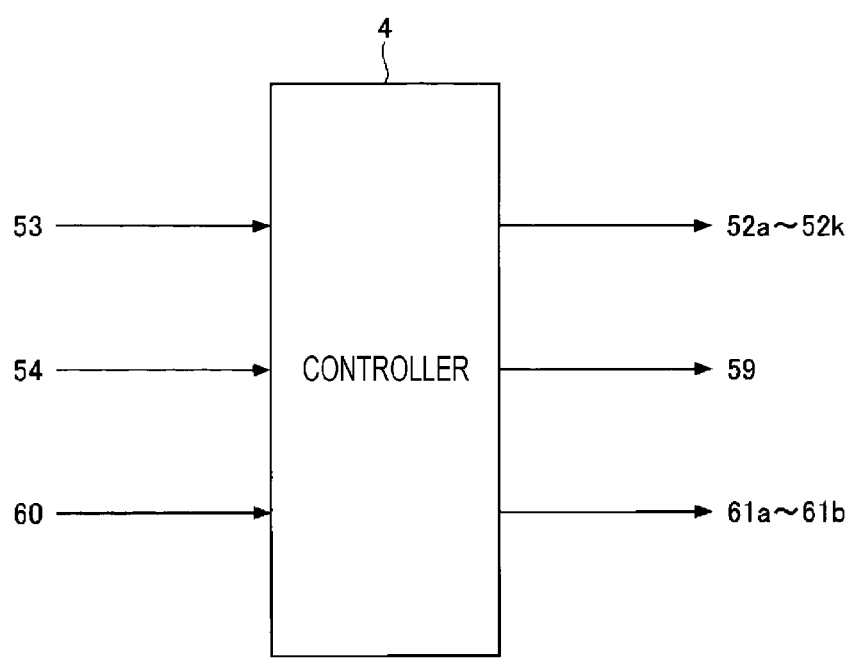
FIG. 7 is a block diagram illustrating a functional configuration of a controller according to the first embodiment.

FIG. 7 is a block diagram illustrating a functional configuration of a controller 4. The controller 4 receives measurement signals from the various elements illustrated in FIG. 6, and transmits control instruction signals to the various elements illustrated in FIG. 6. For example, the controller 4 receives the measurement results of the pressure sensor 53, the temperature sensor 54, and the concentration measuring sensor 60. The controller 4 also sends control instruction signals to the circulation on/off valves 52a to 52k, the exhaust control valve 59, and the exhaust control needle valves 61a to 61b. The signal that may be transmitted and received by the controller 4 is not particularly limited.

[Supercritical Drying Process]

Next, a drying mechanism of IPA using the processing fluid in the supercritical state will be described.

FIGS. 8A to 8D are views for explaining a drying mechanism of IPA and is an enlarged cross-sectional view schematically illustrating the pattern P as a recess of the wafer W.

In the supercritical processing apparatus 3, when the processing fluid R in the supercritical state is initially introduced into the container body 311 of the processing container 301, only the IPA is filled between the patterns P, as illustrated in FIG. 8A.

The IPA between the patterns P is gradually dissolved in the processing fluid R by contacting the processing fluid R in the supercritical state, and gradually replaced with the processing fluid R, as illustrated in FIG. 8B. At this time, in addition to the IPA and the processing fluid R, a mixed fluid M in which the IPA and the processing fluid R are mixed is present between the patterns P.

Then, as the replacement of the IPA with the processing fluid R progresses between the patterns P, the IPA is removed from between the patterns P. Finally, as illustrated in FIG. 8C, the space between the patterns P is filled with only the processing fluid R in the supercritical state.

After the IPA is removed from between the patterns P, by lowering the pressure in the container body 311 to the atmospheric pressure, the processing fluid R changes from the supercritical state to the gaseous state, as illustrated in FIG. 8D, and the space between the patterns P is occupied by only gas. In this way, the IPA in the space between the patterns P is removed and the drying process of the wafer W is completed.

Under the background of the mechanism illustrated in FIGS. 8A to 8D described above, the supercritical processing apparatus 3 of the present embodiment performs an IPA drying process as follows.

That is, a substrate processing method performed by the supercritical processing apparatus 3 includes a step of loading a wafer W having IPA for drying prevention filled on the pattern P into the container body 311 of the processing container 301, a step of supplying a processing fluid in a supercritical state into the container body 311 via the fluid supply (i.e., the fluid supply tank 51, the circulation on/off valve 52a, the circulation on/off valve 52b, and the second lid member 322), and a step of performing a drying process for removing the IPA from the wafer W in the container body 311 using the processing fluid in the supercritical state.

That is, first, the wafer W that has been subjected to the cleaning process in the cleaning apparatus 2 is transferred to the supercritical processing apparatus 3. In the cleaning apparatus 2, for example, a removal of particles and organic pollutants by an SC1 solution which is an alkaline chemical liquid, a rinse cleaning by deionized water (DIW) which is a rinse liquid, a removal of native oxide film by diluted hydrofluoric (DHF) acid aqueous solution which is an acidic chemical liquid, and a rinse cleaning with the DIW are performed in this order, and finally, the IPA is filled on the surface of the wafer. Then, the wafer W is unloaded from the cleaning apparatus 2 in this state and transferred to the processing container 301 of the supercritical processing apparatus 3.

The transfer to the processing container 301 is performed using, for example, the second transfer mechanism 161 (see, e.g., FIG. 1). When the wafer is transferred to the processing container 301, the second transfer mechanism 161 transfers the wafer W to the holding plate 316 waiting at the delivery position, and then retracts from the position above the holding plate 316.

Next, the holding plate 316 is slid horizontally to move the holding plate 316 to the processing position in the container body 311. At this time, the first lid member 315 is accommodated in the first lid member accommodating space 324 and covers the transfer port 312. Subsequently, the first lid member 315 is attracted to the container body 311 by the suction force from the vacuum suction pipe 348 (see, e.g., FIGS. 2 and 3), and the transfer port 312 is closed by the first lid member 315. Then, the elevating mechanism 326 raises the first lock plate 327 to the lock position to bring the first lock plate 327 and the front surface of the first lid member 315 into contact with each other, thereby restricting the movement of the first lid member 315. Although details will be described later, foreign matters may be drawn into the processing space 319 from the discharge side supply line 65 by the suction force of the vacuum suction pipe 348.

Subsequently, before the IPA filled on the surface of the wafer W is dried, the circulation on/off valves 52b and 52c are opened and a high-pressure processing fluid is applied to the processing space 319 via the first supply line 63 and the second supply line 64. As a result, the pressure in the processing space 319 is increased to, for example, about 14 to 16 MPa. According to the pressure applied to the processing space 319, the seal member 339 having a U-shaped cross section provided in the recess 338 of the first lid member 315 is expanded and the gap between the first lid member 315 and the container body 311 is hermetically closed.

Meanwhile, in the processing space 319, when the processing fluid supplied into the processing space 319 contacts the IPA filled on the wafer W, the filled IPA is gradually dissolved in the processing fluid and gradually replaced with the processing fluid. Then, as the replacement of the IPA with the processing fluid progresses between the patterns P of the wafer W, the IPA is removed from between the patterns P. Finally, the space between the patterns P is filled with only the processing fluid in the supercritical state. As a result, the surface of the wafer W is replaced with the processing fluid from the liquid IPA. However, since no interface is formed between the liquid IPA and the processing fluid in an equilibrium state, the fluid on the surface of the wafer W may be replaced with the processing fluid without causing pattern collapse.

Thereafter, when a preset time has passed since the processing fluid was supplied into the processing space 319 and the surface of the wafer W has been replaced with the processing fluid, the circulation on/off valve 52f is opened to discharge the atmosphere in the processing space 319 from the fluid discharge header 318 toward the outside of the container body 311. Thus, the pressure in the container body 311 gradually decreases, and the processing fluid in the processing space 319 changes from the supercritical state to the gaseous state. At this time, since no interface is formed between the supercritical state and the gas, the wafer W may be dried without applying a surface tension to the pattern formed on the surface of the wafer W.

After the supercritical processing of the wafer W is completed by the above process, in order to discharge the processing fluid of the gas remaining in the processing space 319, an inert gas such as nitrogen is supplied from the supply line to which the purge device 62 is connected to perform a purging toward the fluid discharge header 318. Then, when the inert gas is supplied for a predetermined time to complete the purging and the inside of the container body 311 is returned to the atmospheric pressure, the first lock plate 327 is lowered up to the open position. Then, the holding plate 316 is horizontally moved to the delivery position, and the wafer W subjected to the supercritical processing is unloaded using the second transfer mechanism 161.

The second lock plate 337 is constantly raised to the lock position while the above-described supercritical processing is performed. Thus, the second lock plate 337 and the rear surface of the second lid member 322 contact with each other, and the movement of the second lid member 322 is restricted. When the high-pressure processing fluid is not supplied to the processing space 319 and the pressure inside the container body 311 is not increased, the side wall surfaces of the second lid member 322 and the container body 311 directly face each other and crush the seal member 329 to hermetically close the periphery of the maintenance opening 321.

When a high-pressure processing fluid is supplied to the processing space 319, the second lid member 322 moves in the direction away from the processing space 319 (the positive side of the Y direction) by the gap C2 between the fitting holes 335 and 333 around the maintenance opening 321 and the second lock plate 337. The movement of the second lid member 322 widens the gap between the second lid member 322 and the container body 311. In this case, since the notch 329a is expanded due to the restoring force of the seal member 329 having elasticity, the outer peripheral surface of the seal member 329 adheres to the second lid member 322 and the container body 311, and the gap between the second lid member 322 and the container body 311 is hermetically closed. In this way, the second lid member 322 is configured to maintain the state where the maintenance opening 321 is closed while the above-described supercritical processing is performed.

[Foreign Matter Removal Processing]

Next, the foreign matter removing process using the ejector 71a will be described.

As described above, the first lid member 315 is attracted to the container body 311 by the suction force from the vacuum suction pipe 348 (see, e.g., FIGS. 2 and 3), and the transfer port 312 is closed by the first lid member 315. In addition, when the first lock plate 327 moves up and down, particles may be generated by rubbing against the first upper block 312a and the first lower block 312b, but such particles may be removed due to the suction force from the vacuum suction pipe 348. However, foreign matters such as residues generated in the supercritical process may remain in the discharge side supply line 65, and when the processing space 319 is caused to have a negative pressure through the vacuum suction pipe 348, foreign matters remaining in the discharge side supply line 65 may be drawn into the processing space 319. When the next supercritical process is performed on the wafer W while the foreign matters are drawn into the processing space 319, the drawn foreign matters may adhere to the wafer W.

Therefore, in the present embodiment, the foreign matters remaining in the discharge side supply line 65 are removed by using the ejector 71a. FIGS. 9A to 12B are cross-sectional views illustrating an example of a foreign matter removing process using the ejector 71a.

Figure 9A:
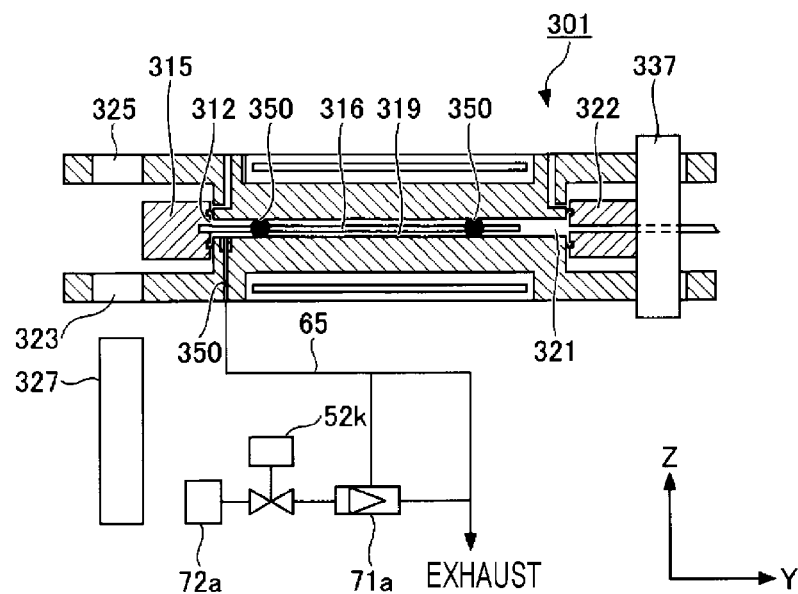
FIGS. 9A and 9B are cross-sectional views (1) illustrating an example of a foreign matter removing process using an ejector.

In the standby state, as illustrated in FIG. 9A, the first lid member 315 closes the transfer port 312. At this time, the first lock plate 327 is in the open position, and the inside of the processing space 319 is, for example, at the atmospheric pressure. In such a standby state, foreign matters 350 such as residues may exist in the processing space 319 and the discharge side supply line 65.

Figure 9B:
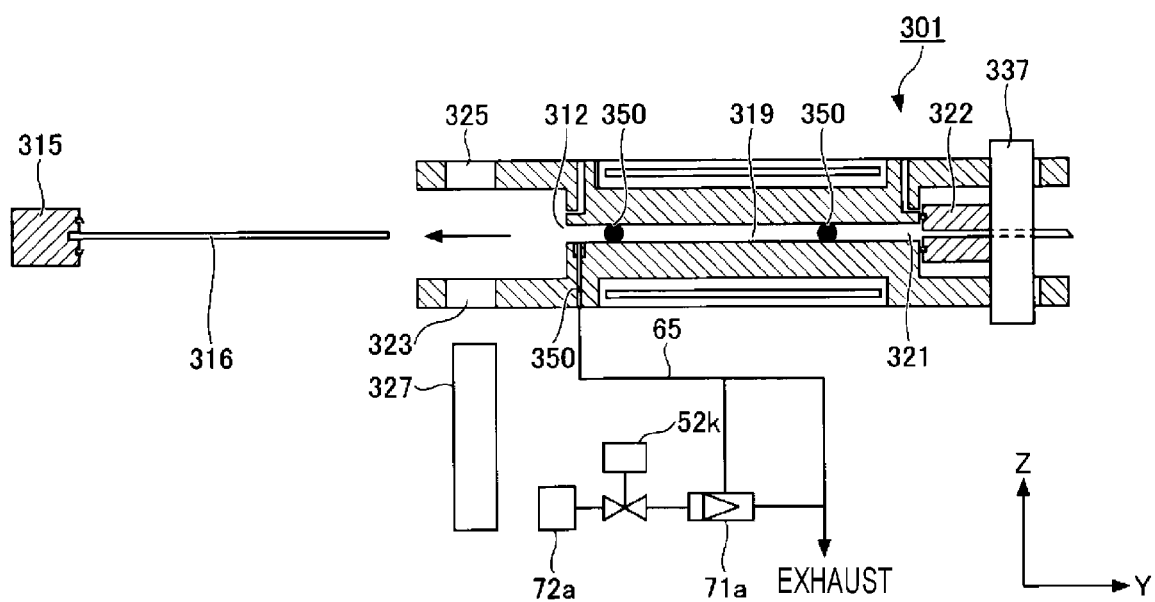

Thereafter, in order to receive the wafer W in the processing container 301, as illustrated in FIG. 9B, the first lid member 315 and the holding plate 316 are slid to the front side (the negative side of the Y direction). As a result, the first lid member 315 is separated from the transfer port 312, and the holding plate 316 is taken out from the processing space 319.

Figure 10A:
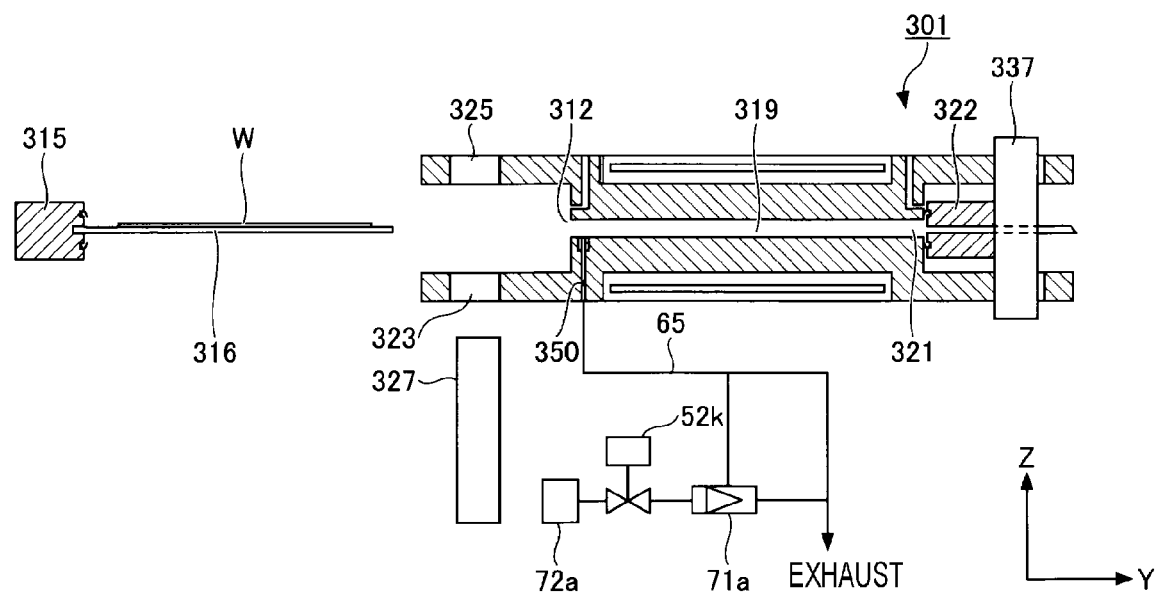
FIGS. 10A and 10B are cross-sectional views (2) illustrating an example of a foreign matter removing process using an ejector.

Next, as illustrated in FIG. 10A, the wafer W is transferred to the holding plate 316. Further, while the first lid member 315 and the holding plate 316 are separated from the transfer port 312, the controller 4 adjusts the circulation on/off valve 52k to the open state. As a result, the ejector 71a starts operating, the exhaust pressure of the ejector 71a is made stronger than the exhaust pressure of the exhaust line of a factory, and the foreign matters 350 in the processing space 319 and the discharge side supply line 65 are discharged to the outside.

Figure 10B:
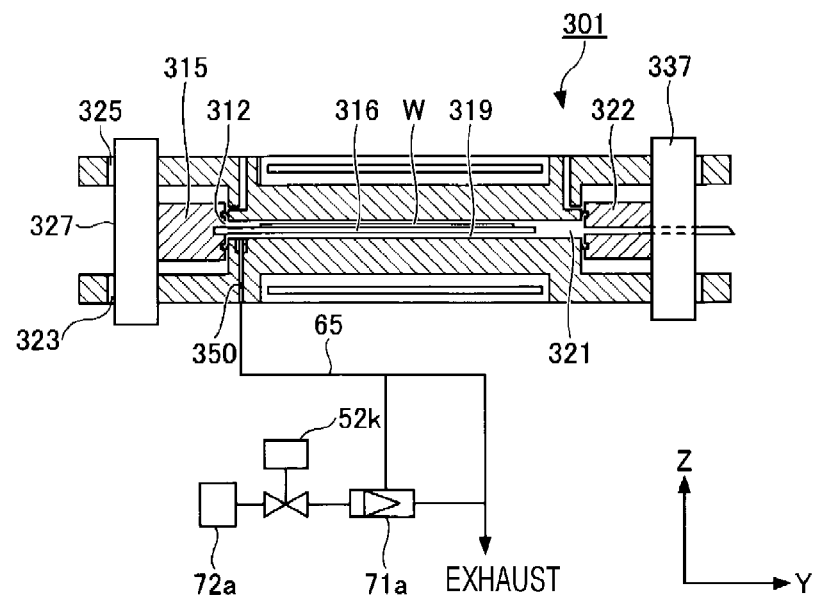

Subsequently, as illustrated in FIG. 10B, the controller 4 adjusts the circulation on/off valve 52k to the closed state. As a result, the operation of the ejector 71a is stopped, and the exhaust pressure of the ejector 71a is made weaker than the exhaust pressure of the exhaust line of a factory. Then, the first lid member 315 and the holding plate 316 are slid to the back side (the positive side of the Y direction), and the holding plate 316 is moved to the processing position in the container body 311. Further, the vacuum suction pipe 348 (see, e.g., FIGS. 2 and 3) is operated. Also, the elevating mechanism 326 raises the first lock plate 327 to the lock position. As a result, the movement of the first lid member 315 is restricted by the first lock plate 327 after the first lid member 315 is attracted to the container body 311.

Figure 11A:
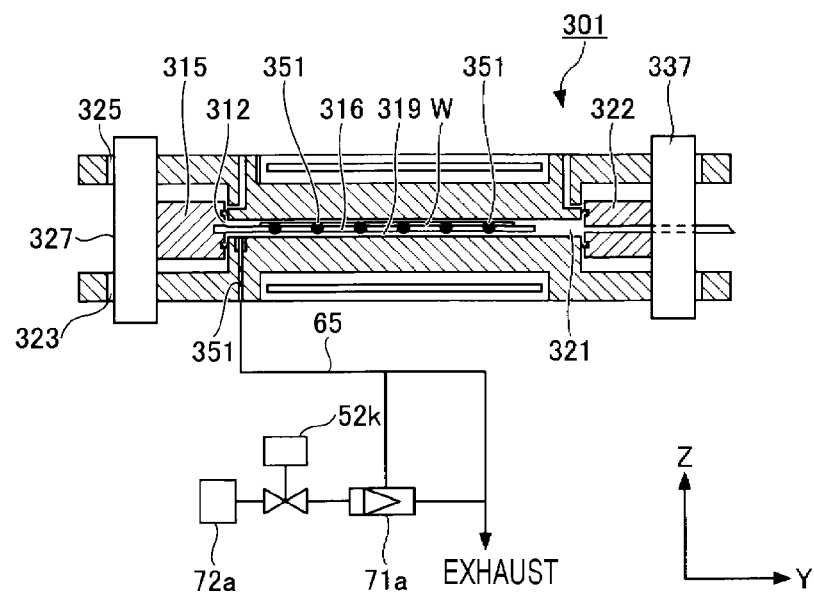
FIGS. 11A and 11B are cross-sectional views (3) illustrating an example of a foreign matter removing process using an ejector.

Thereafter, a supercritical processing is performed. During the supercritical processing, various particles 351 are generated in the processing space 319 as illustrated in FIG. 11A, but most of the particles 351 are discharged to the outside through the discharge side supply line 65. The particles 351 are, for example, IPA-derived particles that are filled on the wafer W or particles that adhere to the wafer W.

Figure 11B:
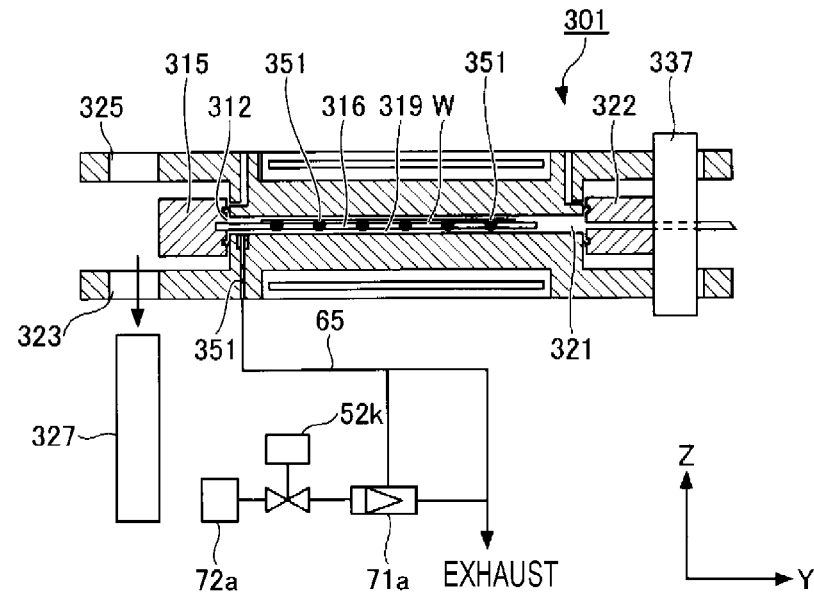

When the supercritical processing is completed, the purging is performed as described above, and when the inside of the container body 311 is returned to the atmospheric pressure, the first lock plate 327 is lowered to the open position as illustrated in FIG. 11B.

Figure 12A:
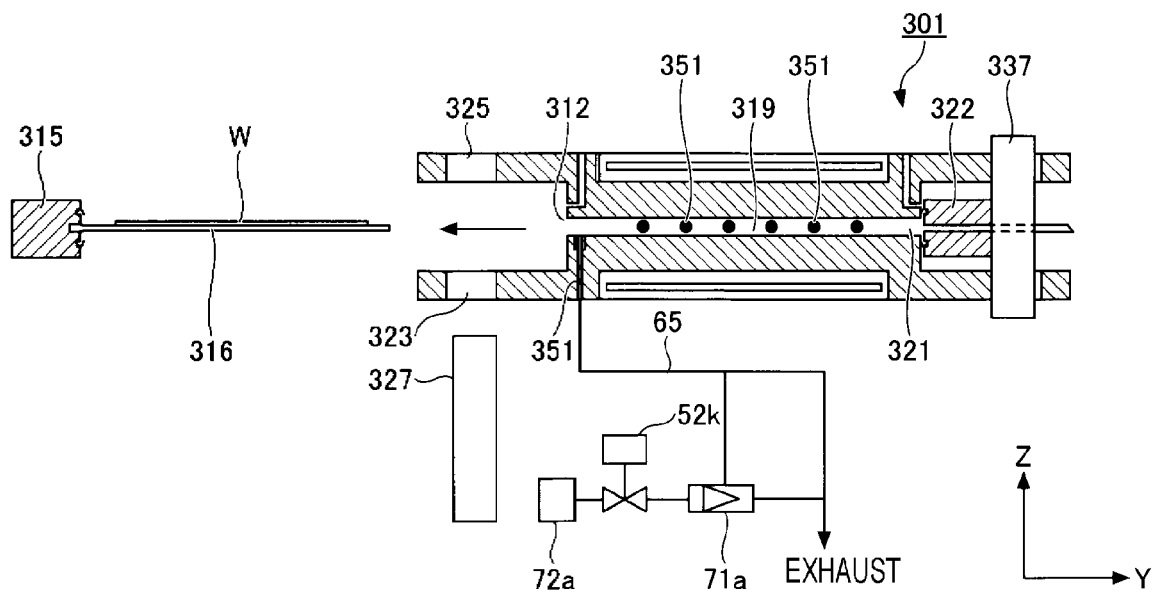
FIGS. 12A and 12B are cross-sectional views (4) illustrating an example of a foreign matter removing process using an ejector.

Thereafter, in order to take out the wafer W, as illustrated in FIG. 12A, the first lid member 315 and the holding plate 316 are slid toward the front side (the negative side of the Y direction). As a result, the first lid member 315 is separated from the transfer port 312, and the holding plate 316 on which the wafer W is placed is taken out from the processing space 319.

Figure 12B:
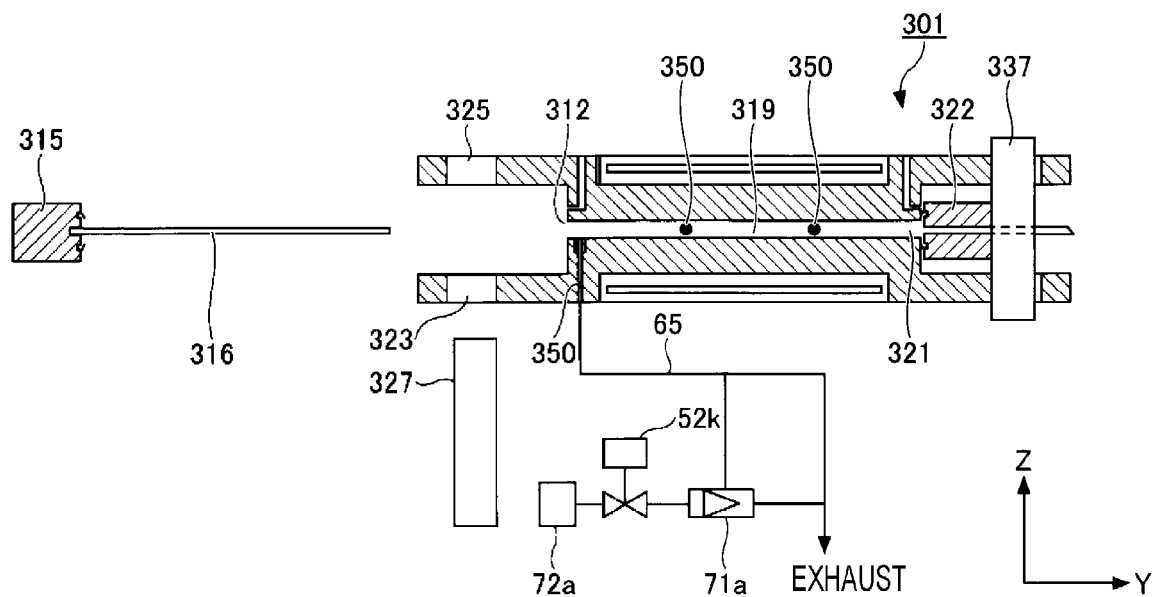

Subsequently, as illustrated in FIG. 12B, the wafer W is unloaded using the second transfer mechanism 161. Further, while the first lid member 315 and the holding plate 316 are separated from the transfer port 312, the controller 4 adjusts the circulation on/off valve 52k to the open state. As a result, the ejector 71a starts operating, the exhaust pressure of the ejector 71a is made stronger than the exhaust pressure of the exhaust line of a factory, and the foreign matters 351 in the processing space 319 and the discharge side supply line 65 are discharged to the outside.

Thereafter, the controller 4 adjusts the circulation on/off valve 52k to the closed state. As a result, the operation of the ejector 71a is stopped, and the exhaust pressure of the ejector 71a is made weaker than the exhaust pressure of the exhaust line of a factory. Then, the holding plate 316 is slid horizontally to move the holding plate 316 to the processing position in the container body 311 and set to the standby state (see, e.g., FIG. 9A). At this time, a part of the particles 351 may exist as the foreign matter 350 in the processing space 319 and the discharge side supply line 65.

According to the first embodiment, the first lid member 315 by the suction force of the vacuum suction pipe 348 may be firmly attracted to the container body 311 side. Further, before the first lid member 315 is attracted to the container body 311 side, a foreign matter removing process using the ejector 71a may be performed. Therefore, even when the foreign matters 350 remain in the discharge side supply line 65 after the supercritical processing of a single wafer W, the foreign matters 350 may be removed from the discharge side supply line 65 until the next wafer W is transferred to the processing space 319. Therefore, after the next wafer W is transferred to the processing space 319, the foreign matters 350 are prevented from being returned to the processing space 319 when the suction force of the vacuum suction pipe 348 is exerted, and the cleanliness of the wafer W may be improved.

Further, the foreign matter removing process may be performed while the first lid member 315 and the holding plate 316 are separated from the transfer port 312. That is, the foreign matter removing process may be executed during a period in which the supply of the processing fluid in the supercritical state to the processing space 319 is stopped and the drying process is not executed. Therefore, it is not necessary to provide a period for the foreign matter removing process in addition to the period for the drying process, and the cleanliness of the wafer W may be improved while suppressing a decrease in throughput.

Second Embodiment

Figure 13:
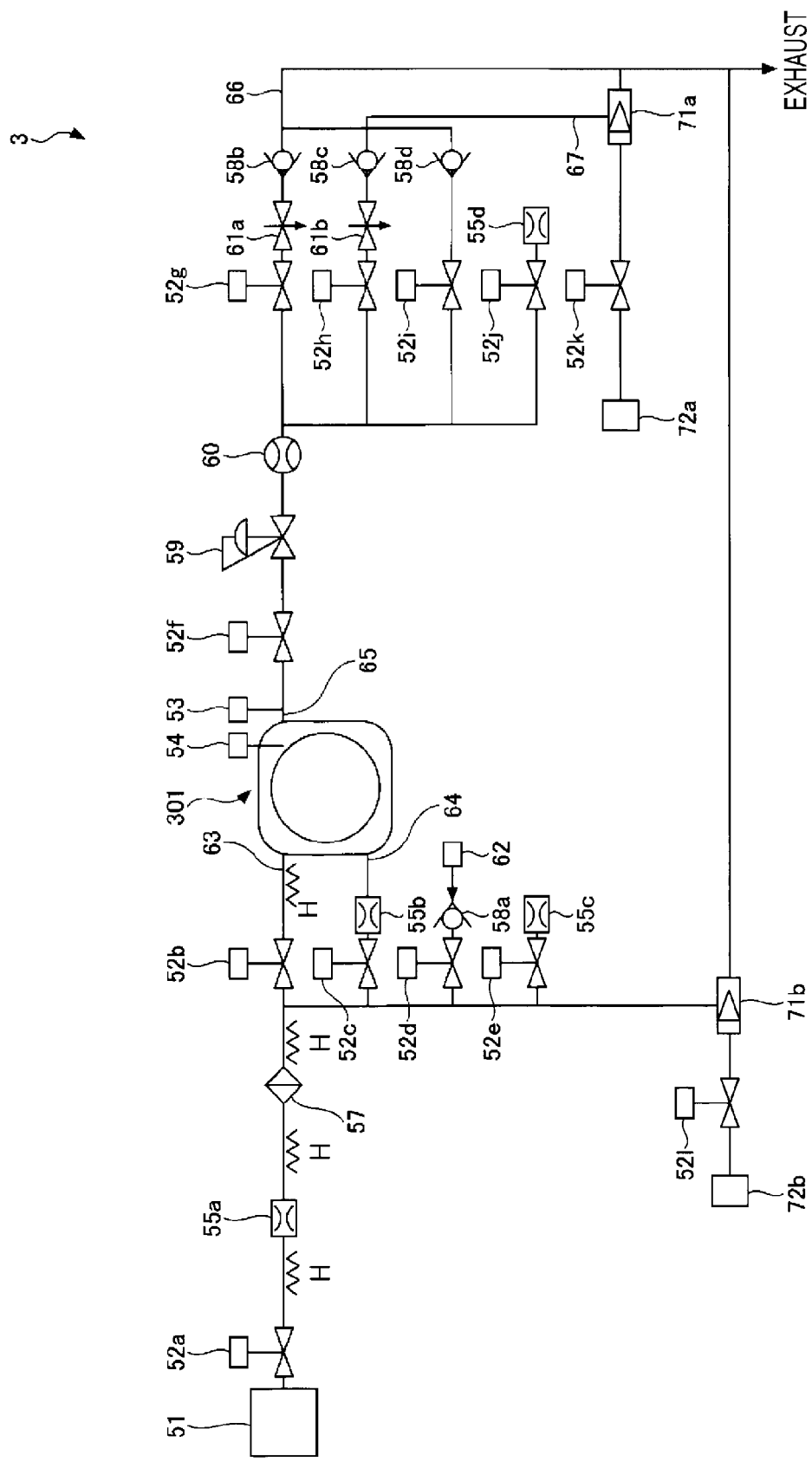
FIG. 13 is a view illustrating a configuration example of the entire system of a supercritical processing apparatus according to a second embodiment.

Next, a second embodiment will be described. The second embodiment is different from the first embodiment in that an ejector is also provided in the supply line on the fluid supply tank 51 side. FIG. 13 is a view illustrating a configuration example of the entire system of the supercritical processing apparatus 3 according to the second embodiment.

As illustrated in FIG. 13, in the second embodiment, the first supply line 63 and the second supply line 64 may be connected to an exhaust line of a factory via the ejector 71b. For example, the first supply line 63 is connected to the ejector 71b between a pressure sensor 53c and the circulation on/off valve 52b, and the second supply line 64 is connected to the ejector 71b between the pressure sensor 53c and the circulation on/off valve 52c. The ejector 71b receives the circulation of a fluid such as air from a fluid supply source 72b, decompresses the insides of the first supply line 63 and the second supply line 64, and forcibly exhausts the first and second supply lines. A circulation on/off valve 521 is provided between the ejector 71b and the fluid supply source 72b. The circulation on/off valve 521 adjusts the on/off of supply of the fluid from the fluid supply source 72b to the ejector 71b, and is controlled by the controller 4. When the circulation on/off valve 521 is in the closed state, since the fluid does not flow through the ejector 71b, the forced exhaust of the first supply line 63 and the second supply line 64 by the ejector 71b is not performed. When the circulation on/off valve 521 is in the open state, since the fluid flows through the ejector 71b, the forced exhaust of the first supply line 63 and the second supply line 64 by the ejector 71b is performed. Therefore, when the circulation on/off valve 521 is adjusted to the open state while the first supply line 63 and the second supply line 64 are opened, the insides of the first supply line 63 and the second supply line 64 are forcibly exhausted. A vacuum pump may be used instead of the ejector 71b.

Other configurations are the same as those of the first embodiment.

For example, the foreign matter removing process using the ejector 71b may be performed at the same timing as the foreign matter removing process using the ejector 71a. According to the second embodiment, even when the foreign matters 350 enter the first supply line 63 and the second supply line 64, it is possible to suppress the pullback of the foreign matters 350 from the first supply line 63 and the second supply line 64 to the processing space 319.

Further, when the first supply line 63 and the second supply line 64 are located in the vicinity of the vacuum suction pipe 349, it is particularly preferable to perform the foreign matter removal processing using the ejector 71b even after the maintenance is completed. This is because the foreign matter 350 may be pulled back into the processing space 319 by the suction force of the vacuum suction pipe 349.

Third Embodiment

Figure 14:
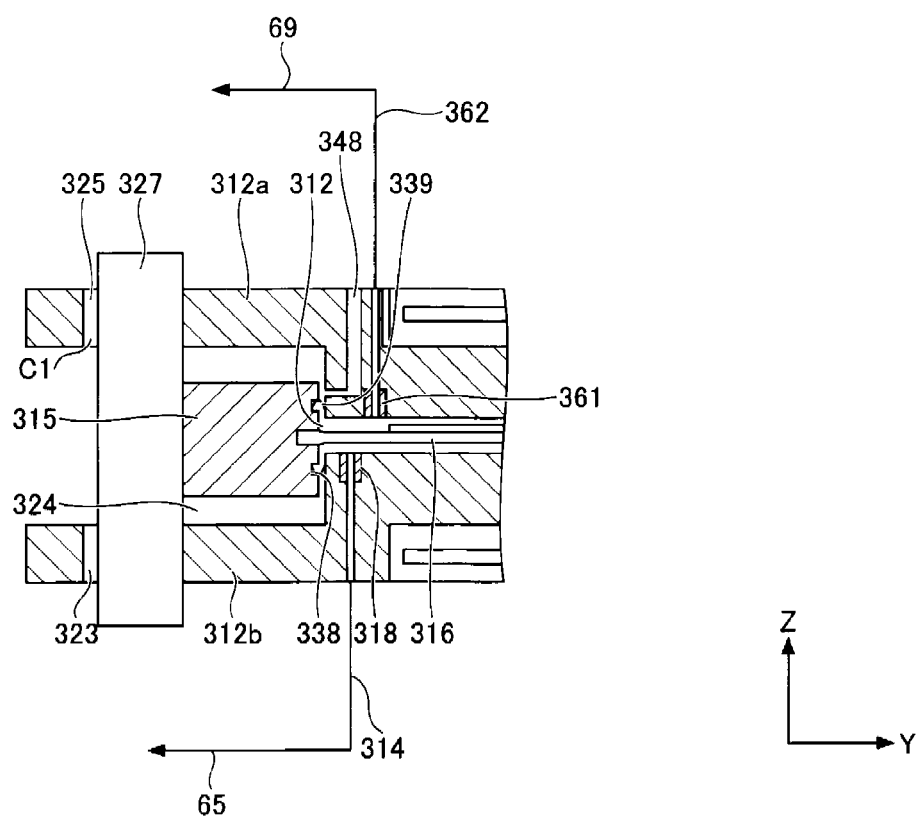
FIG. 14 is a cross-sectional view illustrating a part of a processing container according to a third embodiment.

Next, a third embodiment will be described. The third embodiment is different from the first embodiment in that an inert gas exhaust line is provided. FIG. 14 is a cross-sectional view illustrating a part of a processing container 301 according to the third embodiment.

As illustrated in FIG. 14, in the third embodiment, a discharge port 362 is provided on the wall portion of the container body 311 on the side of the transfer port 312. The discharge port 362 is connected to an inert gas exhaust line 69 provided on the downstream side of the processing container 301 for circulating the inert gas. For example, the exhaust line 69 is provided separately from the discharge side supply line 65. In addition, FIG. 14 illustrates two discharge ports 362, but the number of the discharge ports 362 is not particularly limited. Further, an inert gas discharge header 361 that communicates with the discharge port 362 is provided on the wall portion of the container body 311 on the transfer port 312 side.

Other configurations are the same as those of the first embodiment.

The supercritical processing may also be performed while supplying an inert gas such as a nitrogen gas, a helium gas, a neon gas, or an argon gas to the processing container 301. In this case, the inert gas discharge header 361 and the exhaust port 362 may be used to exhaust the inert gas through the exhaust line 69.

A discharge header, a discharge port 362, and an exhaust line 69 may be provided in the second embodiment.

According to the present disclosure, it is possible to improve the cleanliness of a wafer after a drying process using a processing fluid in a supercritical state.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a processing container including a processing space capable of accommodating a substrate in a state where a surface of the substrate is wet by a liquid;
   a processing fluid supply configured to supply a processing fluid in a supercritical state to the processing space toward the liquid;
   a first exhaust line connected to a first exhaust source and configured to exhaust the processing space at a first exhaust pressure;
   a first on/off valve interposed in the first exhaust line;
   a second exhaust line including an ejector positioned therein, the second exhaust line having a first end positioned upstream of the ejector and connected to a first point on the first exhaust line between the first on/off valve and the first exhaust source and a second end positioned downstream of the ejector and connected to the first exhaust source at a second point downstream from the first point;
   an exhaust fluid supply connected to the ejector and configured to exhaust the processing space through the first exhaust line at a second exhaust pressure via the ejector; and
   a controller configured to control an overall operation of the substrate processing apparatus, wherein the controller is programmed to:
      control the processing fluid supply to supply the processing fluid in the supercritical state to the liquid to dry the substrate in the processing space, and
      control the exhaust fluid supply such that the second exhaust pressure provided via the ejector is higher than the first exhaust pressure during a period in which the processing fluid supply stops supplying the processing fluid to the processing space.

2. The substrate processing apparatus according to claim 1, wherein the controller controls the second exhaust pressure to be higher than the first exhaust pressure after the drying of the substrate is completed.

3. The substrate processing apparatus according to claim 2, wherein the controller controls the second exhaust pressure to be higher than the first exhaust pressure before the processing fluid supply starts supplying the processing fluid.

4. The substrate processing apparatus according to claim 3, further comprising:
   a back pressure valve interposed between the first on/off valve of the first exhaust line and the first exhaust source,
   wherein the second exhaust line is connected between the back pressure valve and the first exhaust source.

5. The substrate processing apparatus according to claim 4, wherein the controller sets the first on/off valve and the back pressure valve to an open state when controlling the second exhaust pressure to be higher than the first exhaust pressure.

6. The substrate processing apparatus according to claim 5, wherein the first exhaust line includes:
   a first exhaust pipe through which the processing fluid flows; and
   a second exhaust pipe through which an inert gas flows.

7. The substrate processing apparatus according to claim 1, further comprising:
   a second on/off valve interposed between the exhaust fluid supply and the ejector and configured to be controlled by the controller.

8. The substrate processing apparatus according to claim 1, wherein the controller controls the second exhaust pressure to be higher than the first exhaust pressure before the processing fluid supply starts supplying the processing fluid.

9. The substrate processing apparatus according to claim 1, wherein the first exhaust line includes:
   a first exhaust pipe through which the processing fluid flows; and
   a second exhaust pipe through which an inert gas flows.

10. A method of controlling a substrate processing apparatus including:
    a processing container having a processing space capable of accommodating a substrate in a state where a surface of the substrate is wet by a liquid;
    a processing fluid supply configured to supply a processing fluid in a supercritical state to the processing space toward the liquid;
    a first exhaust line connected to a first exhaust source and configured to exhaust the processing space at a first exhaust pressure;
    a first on/off valve interposed in the first exhaust line;
    a second exhaust line including an ejector positioned therein, the second exhaust line having a first end connected to a first point on the first exhaust line between the first on/off valve and the first exhaust source and a second end downstream of the ejector, the second end being connected to the first exhaust source at a second point downstream from the first point; and
    an exhaust fluid supply connected to the ejector and configured to exhaust the processing space through the first exhaust line at a second exhaust pressure via the ejector;
    the method comprising:

bringing the processing fluid in the supercritical state into contact with the liquid of the substrate to dry the substrate, and controlling the second exhaust pressure to be higher than the first exhaust pressure via the ejector during a period in which the processing fluid supply stops supplying the processing fluid to the processing space.

\* \* \* \* \*